United States Patent
Ueda et al.

(10) Patent No.: US 7,071,034 B2
(45) Date of Patent: Jul. 4, 2006

(54) METHOD OF MAKING SEMICONDUCTOR DEVICE

(75) Inventors: Takashi Ueda, Kyoto (JP); Kiyohiro Isogawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 11/036,508

(22) Filed: Jan. 12, 2005

(65) Prior Publication Data

US 2005/0127507 A1  Jun. 16, 2005

Related U.S. Application Data

(62) Division of application No. 10/043,898, filed on Jan. 11, 2002, now Pat. No. 6,940,184.

(30) Foreign Application Priority Data

Jan. 12, 2001 (JP) .................................. 2001-4434

(51) Int. Cl.
*H01L 21/44* (2006.01)
*H01L 21/48* (2006.01)
*H01L 21/50* (2006.01)

(52) U.S. Cl. ............... 438/124; 438/126; 438/127; 438/26

(58) Field of Classification Search ............... 438/123, 438/124, 125, 126–127, 106, 121, 22, 25–27, 438/29, 112, 118, 617–618
See application file for complete search history.

(56) References Cited

U.S. PATENT DOCUMENTS

| 5,128,209 | A | * | 7/1992 | Sakai et al. ............... 428/421 |
| 5,170,009 | A | | 12/1992 | Kadokura |
| 5,482,760 | A | | 1/1996 | Takeuchi |
| 6,046,075 | A | | 4/2000 | Manteghi |
| 6,100,318 | A | * | 8/2000 | Zipplies .................. 524/236 |
| 6,177,726 | B1 | | 1/2001 | Manteghi |
| 6,229,688 | B1 | * | 5/2001 | Kobayashi et al. ......... 361/523 |
| 6,245,259 | B1 | | 6/2001 | Hohn et al. |

FOREIGN PATENT DOCUMENTS

JP 04196601 A 7/1992
WO 96/37255 11/1996

* cited by examiner

*Primary Examiner*—Hoai Pham
*Assistant Examiner*—Dilinh Nguyen
(74) *Attorney, Agent, or Firm*—Hamre, Schumann, Mueller & Larson, P.C.

(57) ABSTRACT

A semiconductor device includes a first lead having an inner portion on which a semiconductor chip is mounted, a second lead having an inner portion electrically connected to the semiconductor chip via a wire and a resin package for sealing the semiconductor chip and the wire. The inner portions, the semiconductor chip and the wire are coated with a coating film formed of amorphous fluororesin.

5 Claims, 7 Drawing Sheets

METHOD OF MAKING SEMICONDUCTOR DEVICE

This application is a divisional of application Ser. No. 10/043,898, filed Jan. 11, 2002 now U.S. Pat. No. 6,940,184 which application is incorporated herein by reference.

BACKGROUND OF THE INVENTION

1. Field of the Invention

The present invention relates to a semiconductor device such as an illuminator which includes an LED chip and a resin package for sealing the LED chip. The present invention also relates to a method of making such a semiconductor device.

2. Description of the Related Art

An example of semiconductor devices is an illuminator incorporating an LED chip. FIGS. 7 and 8 illustrate a typical prior art illuminator for use in a display of a mobile phone as a light source or in a photointerrupter for example. As shown in FIGS. 7 and 8, the illuminator 100 comprises a first lead 2 having an inner portion on which an LED chip 1 is mounted, a second lead 3 having an inner portion electrically connected to the LED chip 1 via a wire 4, and a transparent resin package 5 for sealing the LED chip 1 and the wire 4. In this illuminator 100, the LED chip 1 is surrounded by a shock absorber 107 within the resin package 5.

The LED chip 1 may be provided by forming a p-type semiconductor layer, a light emitting layer, and an n-type semiconductor layer by epitaxial growth on a semiconductor wafer, forming electrodes on the semiconductor wafer, and dividing the wafer into chips of a desired size by dicing.

The shock absorber 107 is formed before the formation of the resin package 5. The shock absorber 107 functions to protect the LED chip from breaking in forming the resin package 5. The shock absorber 107 maybe formed of a soft resin called JCR (Junction Coating Resin).

The resin package 5 is generally formed of a transparent epoxy resin which does not contain a filler, because such a resin is relatively inexpensive and is easily hardened by heating.

Specifically, for forming the resin package 5, the respective inner portions of the first lead 2 and the second lead 3 together with the LED chip 1 and the wire 4 are disposed in a cavity having a predetermined configuration defined by a mold. Then, an epoxy resin in a fluid state is injected into the cavity and heated for hardening. At this time, the epoxy resin tends to thermally expand in the cavity to compress the LED chip 1.

The LED chip 1, which is obtained by cutting a wafer, may suffer strains at the cut surfaces. Therefore, when the LED chip 1 is compressed by the epoxy resin, the LED chip may start breaking at the cut surfaces. Particularly, since a transparent epoxy resin, which has a greater coefficient of linear expansion as compared with a black epoxy resin, is used for forming the resin package 5, the possibility of breakage of the LED chip 1 due to the expansion of the resin is relatively high.

In the prior art device, however, the LED chip 1 is surrounded by the shock absorber 107 before the resin package 5 is formed. Therefore, in forming the resin package 5, the pressing force of the resin toward the LED chip 1 is absorbed by the resiliency of the shock absorber 107. In this way, the shock absorber 107 protects the LED chip 1.

The shock absorber 107 is generally formed of a soft resin such as a transparent silicone resin. However, since silicone resin is used in a gel state for forming the shock absorber 107, the thickness of the shock absorber 107 becomes relatively large. As a result, the shock absorber 107 may cause lens effect for refracting the light emitted from the LED chip 1.

Further, the shock absorber 107 is formed by surrounding the LED chip 1 by a silicone resin in a gel state and then heating the resin in a furnace for example for hardening. Such process steps are rather troublesome and hinder the efficient manufacturing of the light emitting diode 100.

SUMMARY OF THE INVENTION

It is therefore an object of the present invention to provide a semiconductor device in which a semiconductor chip is protected by a protector which does not cause lens effect.

Another object of the present invention is to provide a method of making such a semiconductor device.

According to a first aspect of the present invention, a semiconductor device comprises a first lead having an inner portion, a semiconductor chip mounted on the inner portion of the first lead, a second lead having an inner portion electrically connected to the semiconductor chip, and a resin package for sealing the semiconductor chip together with the inner portions of the first and second leads. At least the semiconductor chip is coated with a coating film formed of amorphous fluororesin.

Preferably, the semiconductor chip may be electrically connected to the inner portion of the second lead via a wire, and the coating film may also cover the wire and the inner portions of the first and second leads.

Preferably, the amorphous fluororesin may be PTFE (polytetrafluoroethylene). Further, the coating film may preferably have a thickness of 5–50 µm, particularly 5–20 µm.

In one embodiment of the present invention, the semiconductor chip is an LED chip, and the resin package is formed of a transparent resin.

According to a second aspect of the present invention, there is provided a method of making a semiconductor device comprising the steps of mounting a semiconductor chip on an inner portion of a first lead, electrically connecting the semiconductor chip to an inner portion of a second lead, coating at least the semiconductor chip with a coating film formed of amorphous fluororesin, and molding a resin package for sealing the semiconductor chip together with the inner portions of the first and second leads.

Preferably, the semiconductor chip may be electrically connected to the inner portion of the second lead via a wire, in which case the coating step may be performed for causing the coating film to also cover the wire and the inner portions of the first and second leads.

Preferably, the coating step may be performed by using PTFE as the amorphous fluororesin. Further, the coating step may be performed until the coating film grows to a thickness of 5–50 µm, particularly 5–20µm.

Preferably, the coating step may be performed by applying a amorphous fluororesin mixed with a volatile solvent and drying the same.

Preferably, the molding step may be performed by using a transparent resin.

Other features and advantages of the present invention will become clearer from the detailed description given below with reference to the accompanying drawings.

DETAILED DESCRIPTION OF THE PREFERRED EMBODIMENT

Figure 7:
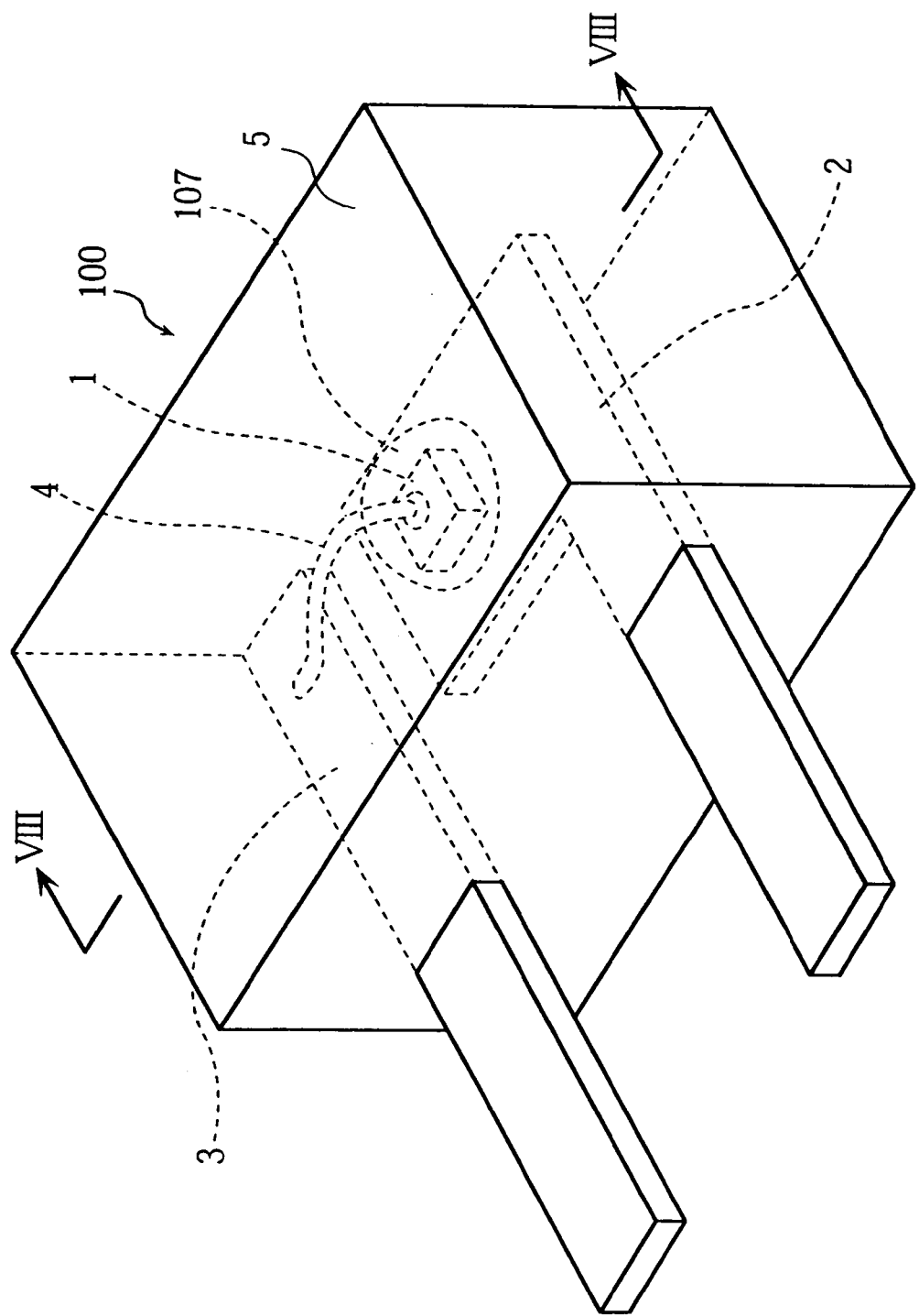
FIG. 7 is a schematic perspective view showing a prior art semiconductor device.
Figure 8:
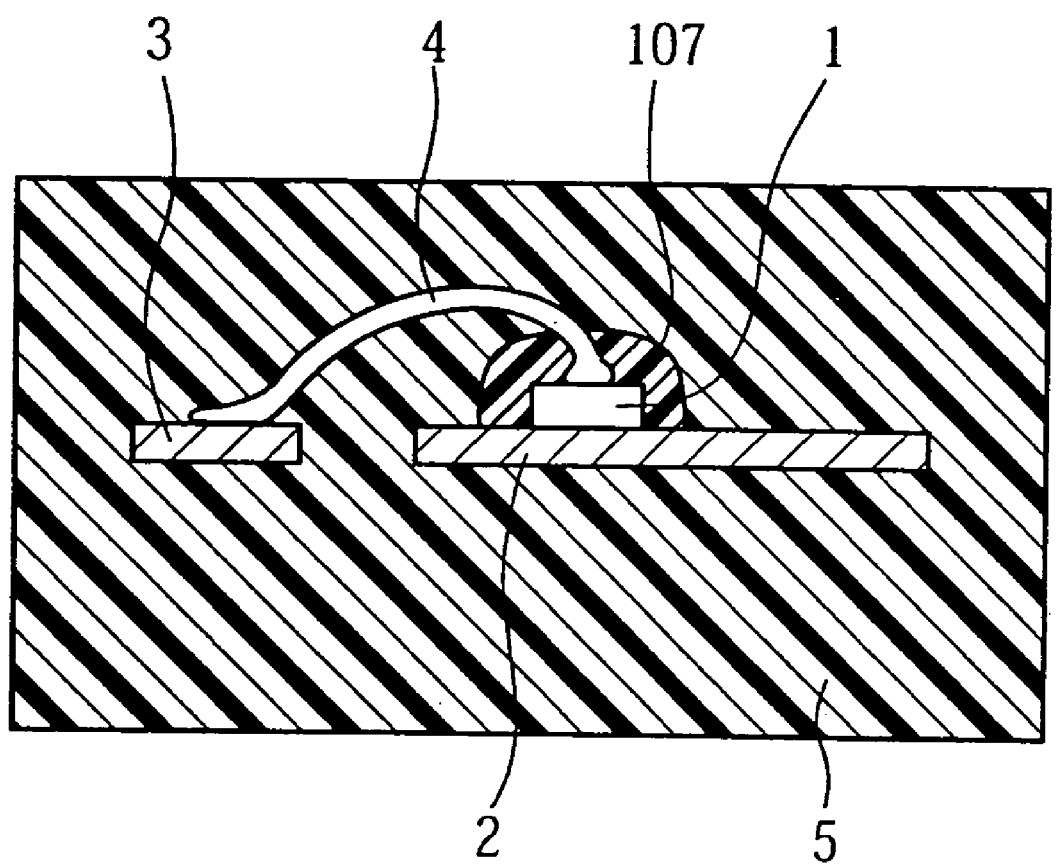
FIG. 8 is a sectional view taken on lines VIII—VIII in FIG. 7.

A preferred embodiment of the present invention will be described below in detail with reference to FIGS. 1 through 6. In these figures, the elements which are identical or similar to those of the prior art device shown in FIGS. 7 and 8 are designated by the same reference signs as those used for the prior art device.

Figure 1:
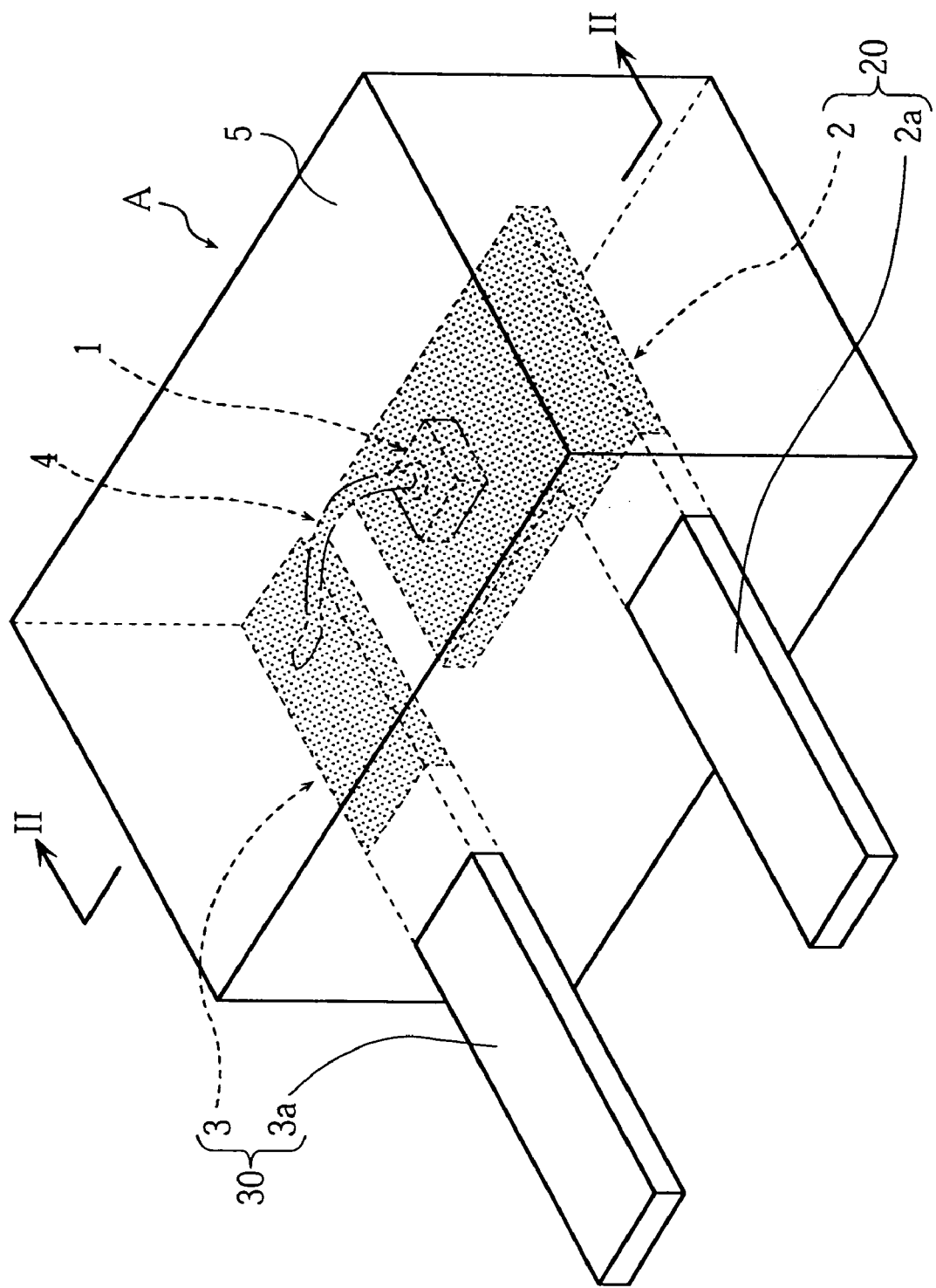
FIG. 1 is a schematic perspective view showing a semiconductor device embodying the present invention.
Figure 2:
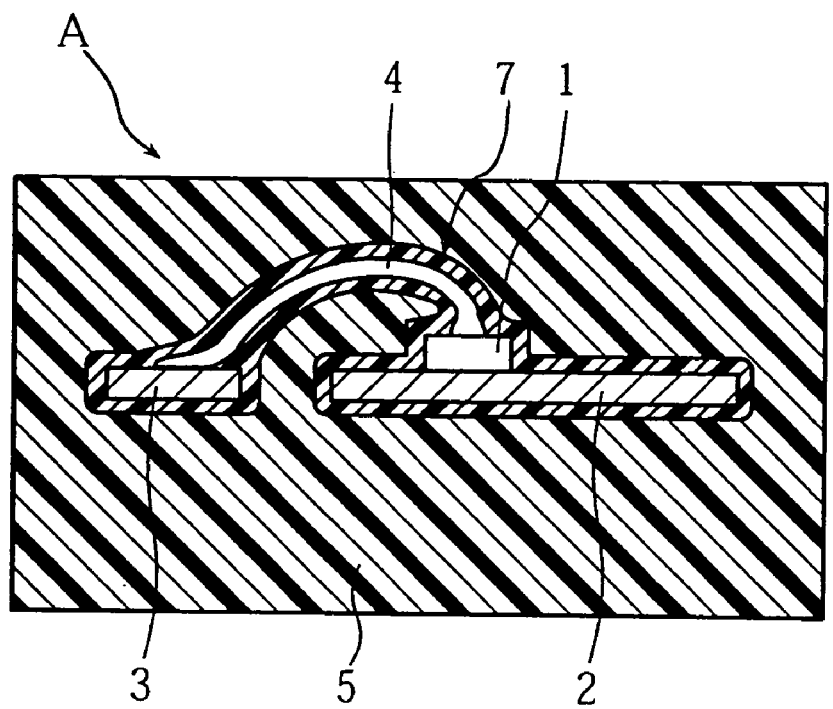
FIG. 2 is a sectional view taken on lines II—II in FIG. 1.

As shown in FIGS. 1 and 2, a semiconductor device A embodying the present invention comprises a first lead 20, a second lead 30, a semiconductor chip 1 mounted on the first lead 20, a wire 4 for connecting the semiconductor chip 1 to the second lead 30, and a resin package 5. The resin package 5 seals the semiconductor chip 1, the wire 4 and part of the first and the second leads 20, 30.

The first lead 20 includes an inner portion 2 sealed in the resin package 5 and an outer portion 2a projecting outward from the resin package 5. Similarly, the second lead 30 includes an inner portion 3 sealed in the resin package 5 and an outer portion 3a projecting outward from the resin package 5. The semiconductor chip 1 is mounted on the inner portion 2 of the first lead 20 and electrically connected via the wire 4 to the inner portion 3 of the second lead 30. In this embodiment, the semiconductor device A is an illuminator incorporating an LED chip as the semiconductor chip 1.

Figure 3:
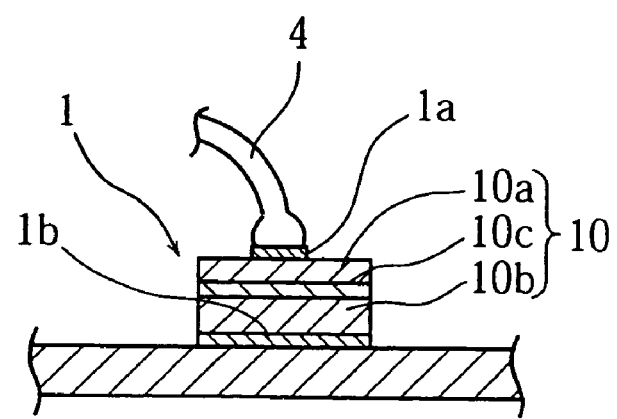
FIG. 3 is a sectional view showing the semiconductor chip of FIG. 2 as enlarged.

As shown in FIG. 3, the semiconductor chip 1 (LED chip) comprises a chip body 10 including an n-type (or p-type) semiconductor layer 10a, a p-type (or n-type) semiconductor layer 10b, and an active layer 10c interposed between the semiconductor layers 10a and 10b. The chip body 10 is provided with a full-surface electrode 1b on the lower surface thereof. The chip body 10 is also provided with an electrode pad 1a on the upper surface thereof.

The LED chip 1 is bonded onto the inner portion 2 of the first lead 20 at the full-surface electrode 1b, whereas the electrode pad 1a of the chip 1 is connected to the inner portion 3 of the second lead 30 via the wire 4. With this structure, when a current flows between the electrodes 1a and 1b, the active layer 10c emits light.

The LED chip 1 may be provided by forming a p-type semiconductor layer, a light emitting layer, and an n-type semiconductor layer by epitaxial growth on a semiconductor wafer, forming a full-surface electrode 1b and an electrode pad 1a on the semiconductor wafer, and dicing the wafer into chips of a desired size.

The wire 4 may be formed of a metal having a good conductivity. Specifically, the wire 4 maybe formed of gold for example.

Figure 4:
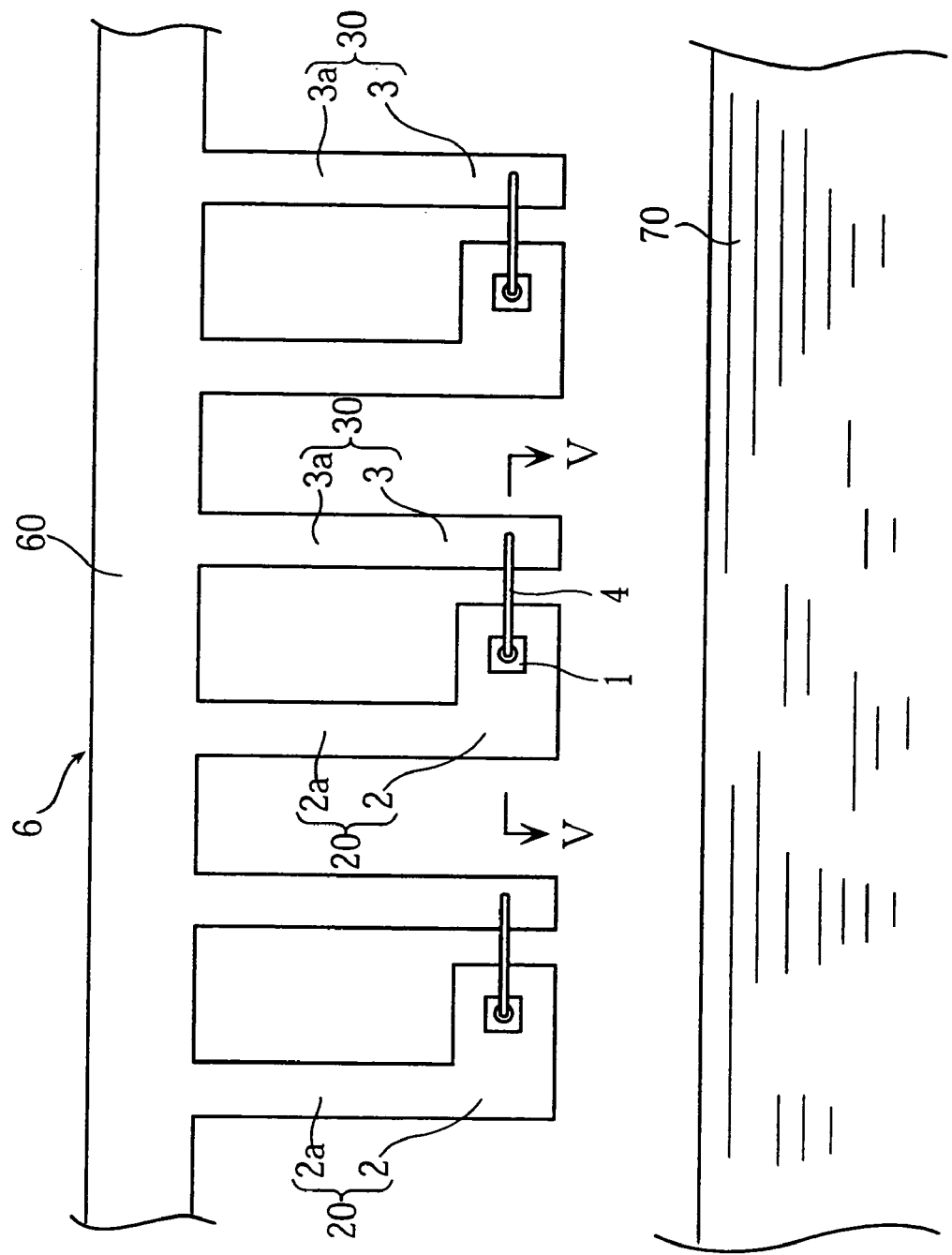
FIG. 4 illustrates a process step of making a semiconductor device embodying the present invention.

The first lead 20 and the second lead 30 are formed as part of a leadframe obtained by punching a metal plate made of copper or iron for example. Specifically, the first lead 20 and the second lead 30 are obtained from a lead frame 6 having such a structure as shown in FIG. 4, where a plurality of first leads 20 and a plurality of second leads 30 are alternately arranged and extend perpendicularly from a side band 60.

The resin package 5 may be formed of a transparent resin. Specifically, use may be made of a transparent epoxy resin which does not contain a filler, because it is relatively inexpensive and is easily hardened by heating.

In the resin package 5, the LED chip 1, the wire 4, the first and the second lead 2, 3 are coated with a coating film 7 formed of amorphous fluororesin. The coating film 7 serves as a protector for protecting the LED chip 1 during the formation of the resin package 5. Generally, amorphous fluororesin has a good compression resistance, and can be easily coated by dipping or spraying. Therefore, the coating film 7 can be formed to have a relatively small thickness (about 10 μm for example).

Specifically, the amorphous fluororesin used may be PTFE (polytetrafluoroethylene). PTFE is a transparent fluororesin which has a great compression resistance.

Next, a method of making the semiconductor device (illuminator) A will be described below.

First, as shown in FIG. 4, a leadframe 60 is prepared which includes a plurality of first leads 20 each having a base portion 2a and a tip portion 2, and a plurality of second leads 30 each having a base portion 3a and a tip portion 3.

Then, an LED chip 1 is mounted on each of the tip portions 2 of the first leads 20. Specifically, the full-surface electrode 1b of the LED chip 1 is bonded to a chip bonding region (not shown) provided in the tip portion 2. Thus, the LED chip 1 is electrically connected to and mechanically supported on the first lead 20.

Subsequently, each of the. LED chips 1 is connected, via a wire 4, to a corresponding one of the second leads 30. Specifically, the wire 4 is bonded at one end to the electrode pad 1c of the LED chip 1 and bonded at the other end to a wire bonding region (not shown) provided in the tip portion 3 of the second lead 30. At this time, the wire 4 is bonded to the electrode pad 1c by the so-called ball bonding while being bonded to the tip portion 3 by the so-called stitch bonding.

Figure 5:
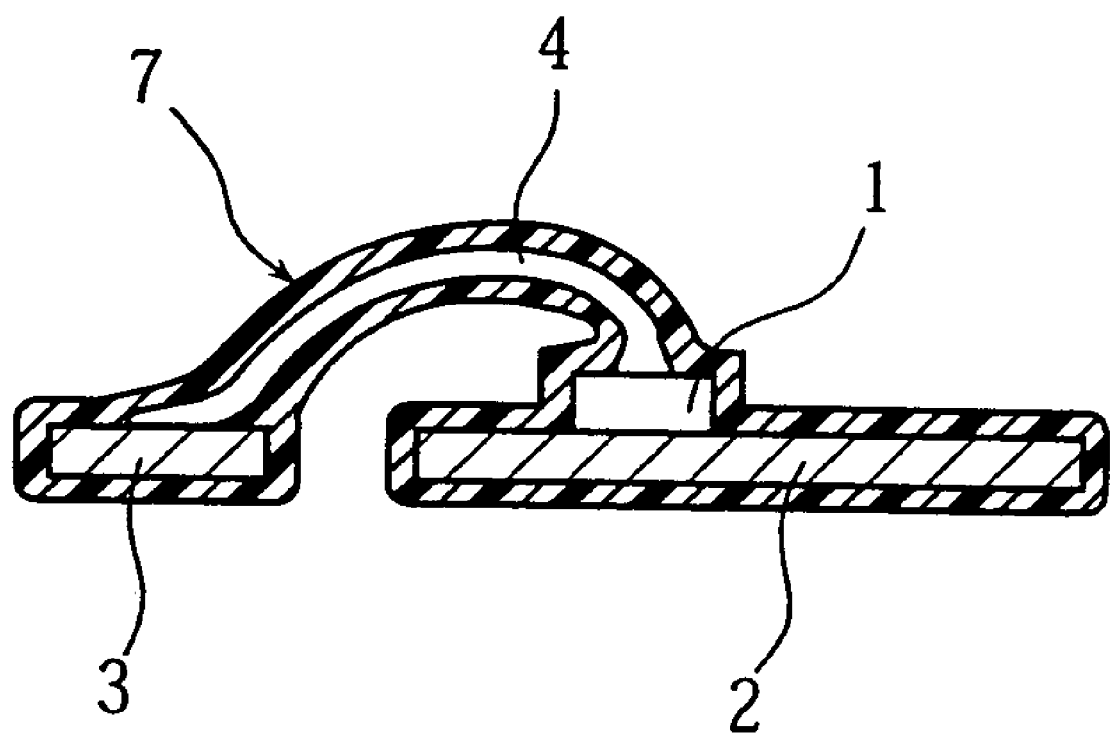
FIG. 5 is a sectional view taken on lines V—V in FIG. 4.

Then, as shown in FIG. 5, the tip portions 2, 3 as well as the LED chips 1 and the wires 4 are coated with a coating film 7. The coating film 7 is formed by applying a coating material 70, which contains an amorphous fluororesin and a volatile solvent, to the tip portions 2, 3. At this time, since the coating material 70 initially has a low viscosity, it is possible to conveniently form a relatively thin coating film.

In this embodiment, the application of the coating material 70 is made by dipping. Specifically, as shown in FIG. 4, tip portions 2, 3 provided with the LED chips 1 and the wires 4 are dipped into a bath of the coating material 70 in a liquid tank for example. With this method, it is possible to apply the coating material 70 collectively with respect to a plurality of LED chips 1 at a time.

Since the solvent contained in the coating material 70 is volatile, the solvent can be removed just by drying. Therefore, the process step of heating the coating material in a curing furnace for hardening is not necessary, which enhances the manufacturing efficiency.

Although the application of the coating material 70 is performed by dipping in this embodiment, it may be performed by spraying.

Figure 6:
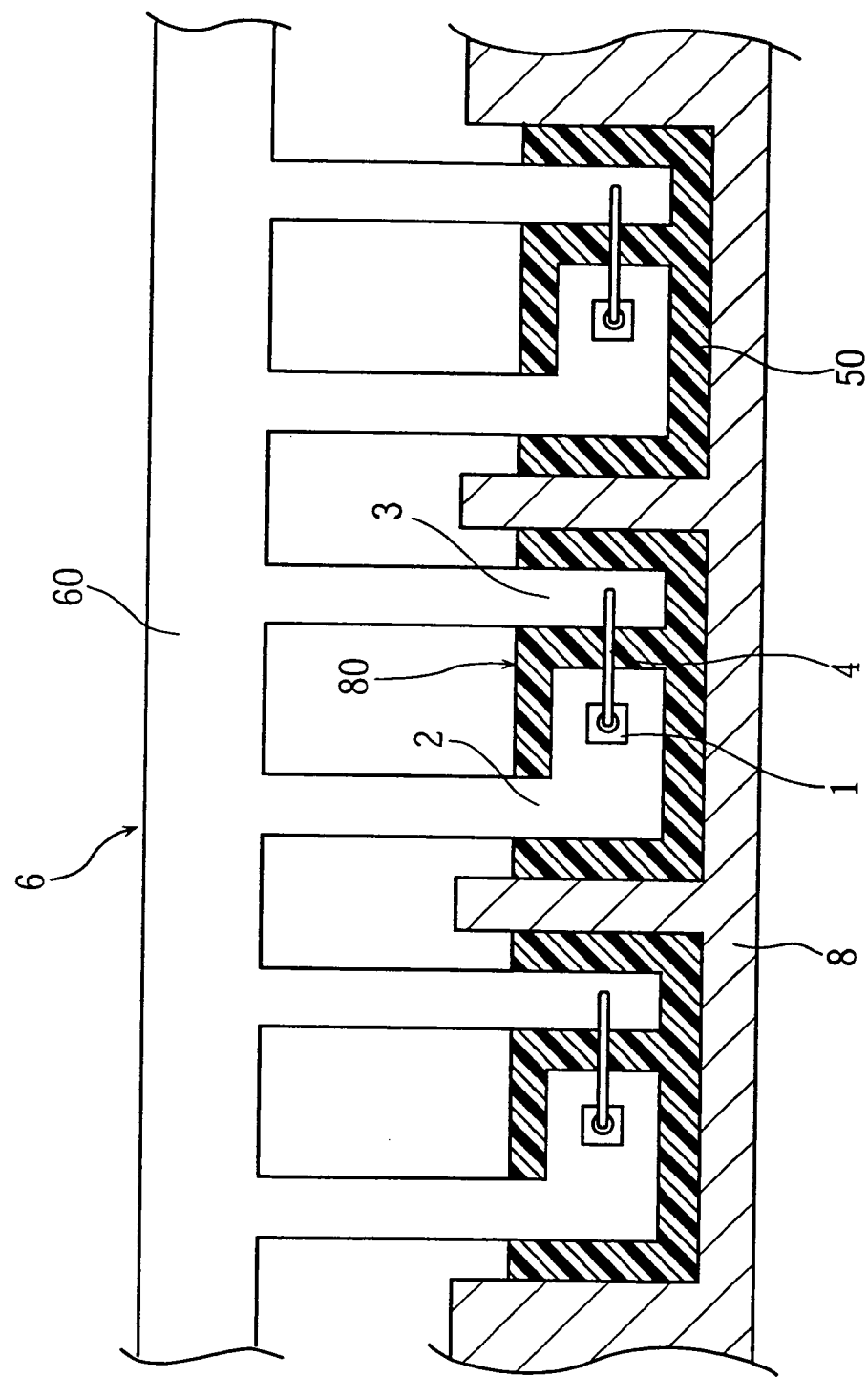
FIG. 6 illustrates a subsequent process step of making the semiconductor device.

Subsequently, a resin package 5 is formed by molding for example using a mold 8 as shown in FIG. 6. Specifically, the leadframe 6 is set relative to the mold 8 so that the tip portions 2, 3 are disposed in a cavity 80 having a predetermined configuration defined by the mold 8. Then, an epoxy resin 50 in a fluid state is injected into the cavity 80 and heated for hardening.

Subsequently, the first leads 2 and the second leads 3 are separated from the leadframe 6 by cutting, thereby providing illuminators A.

The above-described method of making a semiconductor device (illuminator) has the following advantages.

In hardening the epoxy resin 50 by heating for forming the resin package 5, the epoxy resin 50 thermally expands to compress the LED chips 1. However, since the LED chips 1 are covered with the coating film 7, the compression resistance of the coating film 7 protects the LED chips 1 from breaking. In this way, similarly to the shock absorber 7 of the prior art semiconductor device, the coating film 7 functions as a protector for the LED chip 1.

Further, the coating film 7 is formed of a amorphous fluororesin which has a good compression resistance, and can be coated by dipping or spraying. Therefore, the coating film 7 can be made to have a relatively small thickness without deteriorating the function as a protector. Therefore, unlike the shock absorber of the prior art device, the coating film 7 thus formed does not cause the lens effect so that the light emitted from the LED chip 1 is prevented from being refracted.

Although the semiconductor chip is an LED chip in this embodiment, a light receiving element such as a photodiode or a phototransistor may be used.

The present invention being thus described, it is apparent that the same may be varied in many ways. Such variations should not be regarded as a departure from the spirit and scope of the present invention, and all such modifications as would be obvious to those skilled in the art are intended to be included within the scope of the following claims.

The invention claimed is:

1. A method of making a semiconductor device comprising the steps of:
    mounting a light emitting or receiving semiconductor chip on an inner portion of a first lead;
    electrically connecting the semiconductor chip to an inner portion of a second lead;
    coating at least the semiconductor chip with a coating film formed of amorphous fluororesin, the coating film having a thickness of 5–50 µm; and
    molding a resin package for sealing the semiconductor chip together with the inner portions of the first and second leads;
    wherein the coating and molding steps are performed in a manner such that the coating film is entirely spaced from all outer surfaces of the resin package.

2. The method according to claim 1, wherein the semiconductor chip is electrically connected to the inner portion of the second lead via a wire, the coating step is performed for causing the coating film to also cover the wire and the inner portions of the first and second leads.

3. The method according to claim 1, wherein the coating step is performed by using PTFE as the amorphous fluororesin.

4. The method according to claim 1, wherein the coating step is performed by applying an amorphous fluororesin mixed with a volatile solvent and drying the same.

5. The method according to claim 1, wherein the molding step is performed by using a transparent resin.

* * * * *